(12) United States Patent
Koch et al.

(10) Patent No.: US 6,304,189 B1
(45) Date of Patent: Oct. 16, 2001

(54) METHOD FOR DETECTING MALFUNCTIONS OF A FIRST RELAY

(75) Inventors: Stefan Koch, Achern; Rolf Kremser, Schutterwald; Michael Soellner, Lichtenau, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/486,169

(22) PCT Filed: Aug. 19, 1998

(86) PCT No.: PCT/DE98/02410

§ 371 Date: Jun. 15, 2000

§ 102(e) Date: Jun. 15, 2000

(87) PCT Pub. No.: WO99/10780

PCT Pub. Date: Mar. 4, 1999

(30) Foreign Application Priority Data

Aug. 22, 1997 (DE) .............................. 197 36 731
Feb. 12, 1998 (DE) .............................. 198 05 658

(51) Int. Cl.[7] .................................................. G08B 21/00
(52) U.S. Cl. ..................... 340/664; 340/644; 340/635; 324/523
(58) Field of Search ................... 340/664, 644, 340/635, 654; 324/415, 418, 522, 523, 527

(56) References Cited

U.S. PATENT DOCUMENTS

| 5,136,280 | 8/1992 | Bjarne . |
| 5,243,291 | 9/1993 | Heihachiro . |

FOREIGN PATENT DOCUMENTS

| 31 35 888 | 3/1983 | (DE) . |
| 0 563 683 | 10/1993 | (EP) . |
| 0 651 489 | 5/1995 | (EP) . |
| 2 162 391 | 1/1986 | (GB) . |
| 09 213471 | 8/1997 | (JP) . |

*Primary Examiner*—Julie Lieu
(74) *Attorney, Agent, or Firm*—Kenyon & Kenyon

(57) ABSTRACT

A method for detecting faulty switching operations of a first relay whose switching element is connected in series with a load and which, depending on the switch position, interrupts or closes the connection to the load in accordance with switching commands. In this context, a current is detected flowing through a circuit containing the switching element, and a faulty function of the relay, in particular a sticking of the switching element, is detected if the current intensity does not correspond to the current intensity to be expected in accordance with the selected switching position. Further relays, which can be provided in order to commutate the potentials at the load, can be included in the test. The method makes possible a relay test without moving the actuators, assuming the relays are in order. In addition, this generates a time savings, since not all of the relays have to be triggered for the test.

7 Claims, 1 Drawing Sheet

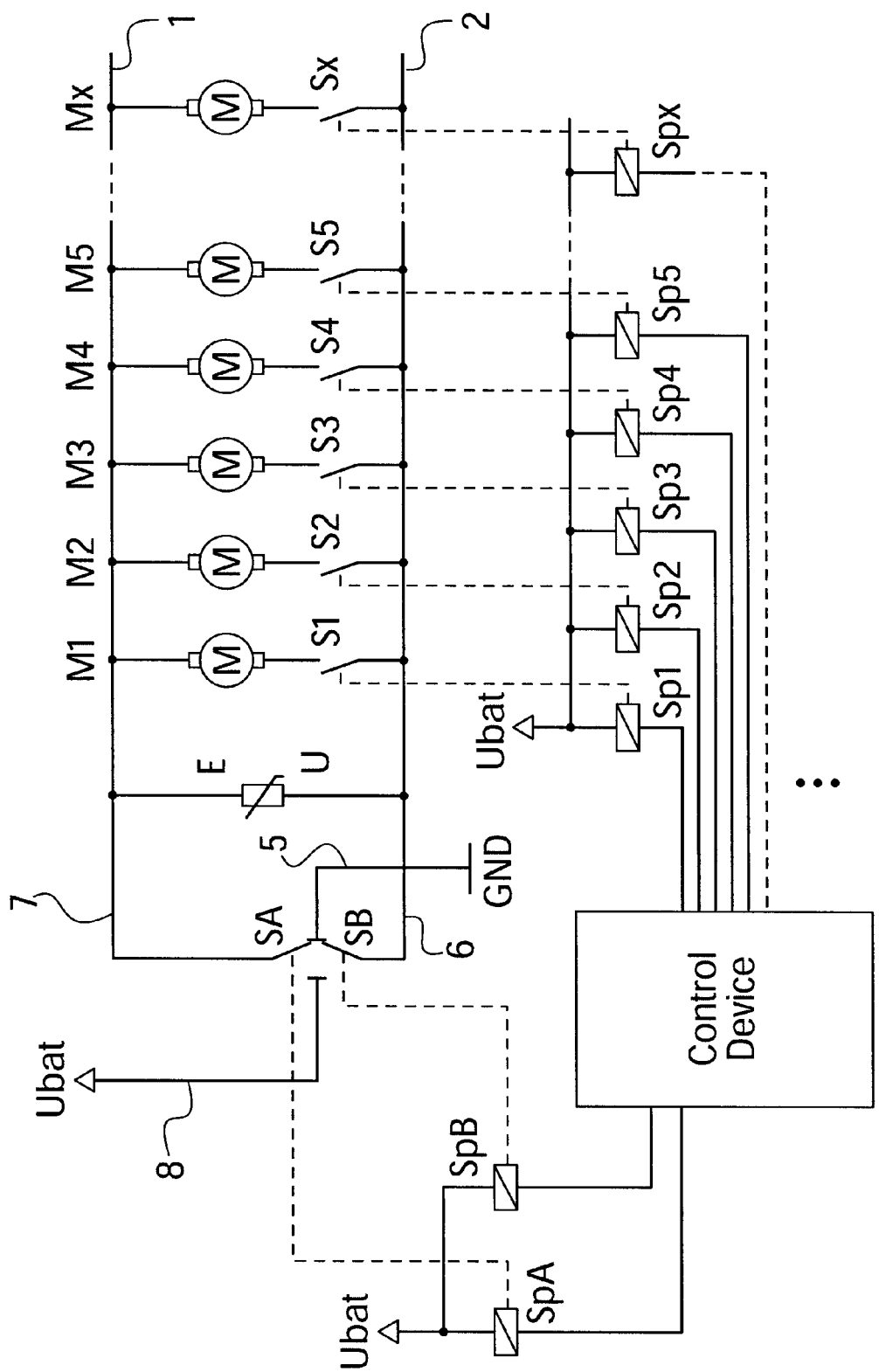

METHOD FOR DETECTING MALFUNCTIONS OF A FIRST RELAY

BACKGROUND INFORMATION

The present invention concerns a method for detecting faulty switching operations of a first relay, whose switching element is connected in series with a load.

From German Patent No. 31 35 888, a method is described which functions to detect faulty switching operations of a relay whose switching element is connected in series with a load and which, in accordance with the switch position, interrupts or closes the connection to the load on the basis of switching commands. If a faulty switching operation is detected, either in the switching commands or in the relays, the driving load is supplied with potential such that it is prevented from starting up. The present detection of faults depends on the detection of given potentials and their quite complex evaluation.

SUMMARY OF THE INVENTION

In contrast, the method according to the present invention for detecting faulty switching operations of a first relay has the advantage of making available a simple and reliable solution, in which a relay test is carried out through a current measurement implemented in an electronic control unit. In an advantageous manner, all relays can therefore be triggered without one of the actuators, designated as load, having to be moved.

In the method according to the present invention, for this purpose, a current is measured that flows through a circuit containing the switching element, and a faulty functioning of the relay, in particular a sticking of the switching element, is detected if the current intensity does not correspond to the current intensity to be expected in accordance with the switch position selected.

According to a particularly effective refinement of the present invention, provision is made for at least one second relay, which, in a switch-over, can connect a first terminal of the circuit to at least two different potentials, and a second terminal of the circuit is connected to the first of the two potentials, and according to the present invention, a switching signal connecting the first terminal to the second potential is sent to the second relay and a switching signal to open is sent to the first relay, and a first fault signal characterizing a fault of the two relays is sent if a current flow is detected in the circuit.

In an advantageous embodiment of this refinement according to the present invention, provision is made that a switching signal for connecting the first terminal to the first potential is sent to the second relay, and a switching signal for closing is sent to the first relay, if no fault was detected in the preceding step, and that a fault signal characterizing a fault of the two relays is sent if a current flow is detected in the circuit.

In a further advantageous embodiment of the present invention, provision is made that a plurality of loads having assigned first relays are connected in parallel to the two terminals, and faults are detected in individual and/or a plurality of relays.

In a particularly advantageous and expedient refinement of the present invention, provision is made for a third relay, using which the second terminal can be connected to one of the two potentials. In accordance with an advantageous application of this refinement according to the present invention, by connecting the third relay, faulty functioning of the second relay is determined, and vice versa.

A further advantageous embodiment of the present invention is characterized by the use of a semiconductor switch in place of at least one of the relays.

DRAWING DESCRIPTION OF THE DRAWING

The FIGURE schematically depicts a block diagram of an actuator drive, depicted on the basis of motors, the the method according to the invention being advantageously suitable to the actuator drive.

The FIGURE schematically depicts in a block diagram the design of an actuator drive, in which the actuators are motors M1, . . . , Mx. Via a first relay 1-X, composed of respective corresponding relay coils Sp1 through Spx and relay contacts S1 through Sx functioning as switching elements, these motors M1, . . . , Mx are connected to the potentials applied to lines 1 and 2. With the assistance of a second relay A, composed of relay coil SpA and corresponding relay contact SA, a line 7 is connected to two different potentials, in the example depicted, either to GND or Ubat. Accordingly, this different potential is applied on the one side of motors M1, . . . , Mx. With the assistance of a further relay B, composed of relay coil SpB and corresponding relay contact SB, a line 6 is connected to two different potentials, in the example depicted, either to Gnd or Ubat. Accordingly, this different potential is applied to the second side of motors M1, . . . , Mx. In this manner, the right-handed or left-handed motion of the motors is determined. Relay coils Sp1 through Spx, SpA and SpB are triggered from a control unit, which emits the corresponding switching signals or switching commands, in order to bring the relay contacts functioning as switching elements into the appropriate switch positions. The effect of the relay coils on the corresponding relay contacts is indicated by the dotted lines.

To carry out the method according to the present invention, provision is advantageously made in the control unit for a microcontroller as well as for a device, not depicted in greater detail in the FIGURE, for the summation current measurement of all actuators, for example, via a shunt resistor in the line between the relay contacts SA/SB, line 5, and the GND potential, or a current measurement of each path separately, or a mixture of the two.

For monitoring the relays depicted in the FIGURE as to whether they are, for example, in the closed "stick" state, the test steps indicated below are sufficient. In this context, the assumption is made of the following normal position of the relay contacts, depicted in the FIGURE: relay contacts S1 through Sx are open, relay contacts SA and SB are at GND potential.

The first test step includes the triggering of relay coil SpA and thus the closing of relay contact SA with respect to line 8. Thus potential Ubat is then at motors M1, . . . , Mx on line 7. If one of relay contacts S1 through Sx is closed erroneously, then the microcontroller measures a current that is greater than zero, i.e., generally, greater than an expected setpoint value, and thus detects that one of relays 1 through x, composed of relay coils Sp1 through Spx as well as corresponding relay contacts S1 through Sx, is "hanging" in the closed position (with respect to line 2). If the control unit or the microcontroller does not measure any current of this type, then all of first relays 1-x assigned to the motors are open, or relay A, composed of relay coil SpA as well as corresponding relay contact SA, is "hanging" with respect to line 5. After this first test step, the arrangement returns to the normal position described above, after the termination of the triggering.

The triggering of the relays undertaken by the control unit for test purposes goes forward so long as the relays operate reliably. On the other hand, the triggering is not maintained so long, so that in the event of a faulty functioning of the relays, it is therefore possible to keep the actuator movement at the lowest level possible. In the selection of the triggering time, the data of the relay used is taken into account.

In an optional test step, it is a question of triggering relay coil SpB and thus closing relay contact SB with respect to line 8. Therefore, potential Ubat is present at motors M1, . . . , Mx on line 6. If one of relay contacts S1 through Sx is closed erroneously, then the microcontroller measures a current that is greater than zero, i.e., generally, greater than an expected setpoint value, and it thus detects that one of relays 1 through x, composed of relay coils Sp1 through Spx as well as corresponding relay contacts S1 through Sx, is "hanging" in the closed position (with respect to line 2). If the control unit or the microcontroller does not measure any current of this type, then all of first relays 1-x assigned to the motors are open, or relay A, composed of relay coil SpA as well as corresponding relay contact SA, is "hanging" with respect to line 5. After this first test step, the arrangement returns to the normal position described above, after the termination of the triggering.

Using this first or optional test step, all the relays are monitored. If no current is measured and thus no faulty behavior is established, then no further tests are performed.

A second test step is based on the circumstance that any relay 1 through x, composed of respective corresponding relay coils Sp1 through Spx and relay contacts S1 through Sx, is triggered. If one of relays A or B, composed of relay coil SpA/SpB as well as the corresponding relay contact SA/SB, is closed erroneously, then the microcontroller measures a current that is greater than zero. It is thus detected that one of relays A or B is "hanging" in position with respect to potential Ubat on line 8. After the second test step, the arrangement returns to the normal position described above, after the termination of the triggering.

The test with respect to the "hanging" of relays 1-x in the open position or of relays A and B with respect to the GND potential takes place through a minimum current detection in the normal operation of the system, no current being measured by the micro-comptrollers in response to the actuator triggering. Fault detection takes place subsequently.

The test in accordance with the method according to the present invention can be carried out as desired, for example, after the switching on of the ignition in a motor vehicle, or cyclically or in another suitable manner. The result is available for diagnostic purposes and can be integrated in the functionality of the control unit. Thus, for example, care can be taken that in the ascertainment of a relay faulty functioning, no further triggering of the corresponding actuator takes place.

The method according to the present invention can also be advantageously employed if provision is made for the use of a semiconductor switch in place of at least one of the relays. As a semiconductor switch, use can be made, for example, of a MOSFET transistor.

The method according to the present invention makes possible a relay test without moving the actuators, assuming that the relays are in order. This yields, in addition, a time savings, since it is unnecessary to trigger all of the relays for the test.

What is claimed is:

1. A method for detecting a faulty switching operation of a first relay including a switching element connected in series with a load according to a connection, comprising the steps of:

depending on a switch position, causing the first relay to perform one of an interruption and a closing of the connection to the load in accordance with a switching command;

detecting a current flowing through a circuit including the switching element;

detecting a faulty function of the first relay if a current intensity does not correspond to an expected current intensity in accordance with a selected switch position;

providing at least one second relay that is operated by a direct voltage and that is capable in a switch-over operation of connecting a first terminal of the circuit to at least two different potentials;

connecting a second terminal of the circuit to a first one of the at least two different potentials;

sending a switching signal to the at least one second relay for connecting the first terminal to a second one of the at least two different potentials;

sending to the first relay a switching signal for causing an opening operation; and sending a first fault signal corresponding to a fault of at least one of the first relay and the at least one second relay if a current flow is detected in the circuit.

2. The method according to claim 1, wherein the faulty function corresponds to a sticking of the switching element.

3. The method according to claim 1, further comprising the steps of:

sending to the second relay a switching signal for connecting the first terminal to the first one of the at least two different potentials;

sending to the first relay a switching signal for causing the closing, if no fault is detected in the step of sending to the second relay the switching signal for connecting the first terminal to the first one of the at least two different potentials; and sending a second fault signal corresponding to the fault of at least one of the first relay and the at least one second relay if the current flow is detected in the circuit.

4. The method according to claim 1, further comprising the steps of:

connecting in parallel a plurality of loads corresponding to the first relay to the first terminal and the second terminal; and detecting whether the fault is present in at least one of the first relay and the at least one second relay.

5. The method according to claim 3, further comprising the step of:

providing a third relay through which the second terminal is capable of being connected to one of the at least two different potentials.

6. The method according to claim 5, wherein a faulty function of the at least one second relay is detected through a connection of the third relay.

7. The method according to claim 1, wherein the first relay is capable of being replaced by a semiconductor switch.

\* \* \* \* \*